US012683609B2

(12) United States Patent
Huang et al.

(10) Patent No.: US 12,683,609 B2
(45) Date of Patent: Jul. 14, 2026

(54) HIGH-NOISE-RESISTANCE AND LOW-DELAY LEVEL SHIFTING CIRCUIT FOR GaN HALF-BRIDGE DRIVING CHIP

(71) Applicant: CHONGQING UNIVERSITY OF POSTS AND TELECOMMUNICATIONS, Chongqing (CN)

(72) Inventors: Yi Huang, Chongqing (CN); Junjie Yi, Chongqing (CN); Shengqi Yu, Chongqing (CN); Xingyu Luo, Chongqing (CN); Sheng Gao, Chongqing (CN); Hongsheng Zhang, Chongqing (CN)

(73) Assignee: CHONGQING UNIVERSITY OF POSTS AND TELECOMMUNICATIONS, Chongqing (CN)

( * ) Notice: Subject to any disclaimer, the term of this patent is extended or adjusted under 35 U.S.C. 154(b) by 0 days.

(21) Appl. No.: 19/136,275

(22) PCT Filed: Jan. 22, 2025

(86) PCT No.: PCT/CN2025/073843
§ 371 (c)(1),
(2) Date: Jun. 5, 2025

(87) PCT Pub. No.: WO2025/251646
PCT Pub. Date: Dec. 11, 2025

(65) Prior Publication Data
US 2026/0012179 A1      Jan. 8, 2026

(51) Int. Cl.
*H03K 19/003*      (2006.01)
*H03K 19/0185*      (2006.01)

(52) U.S. Cl.
CPC ................. *H03K 19/00315* (2013.01); *H03K 19/018521* (2013.01)

(58) Field of Classification Search
CPC ................. H03K 19/00315; H03K 19/018521
(Continued)

(56) References Cited

U.S. PATENT DOCUMENTS

2020/0014386 A1* 1/2020 Ma ................. H03K 19/018507

FOREIGN PATENT DOCUMENTS

CN      109742946 A      5/2019
CN      116885923 A      10/2023
(Continued)

OTHER PUBLICATIONS

International Search Report for PCT/CN2025/073843 mailed Mar. 5, 2025, ISA/CN.
(Continued)

*Primary Examiner* — Regis J Betsch
*Assistant Examiner* — Amit R Bhatia
(74) *Attorney, Agent, or Firm* — Yue (Robert) Xu; Apex Attorneys at Law, LLP

(57) ABSTRACT

A high-noise-resistance and low-delay level shifting circuit for a GaN half-bridge driving chip is provided, relating to the technical field of power management in integrated circuits. A path from a floating power rail VDDH to the ground is arranged to simulate the noise generated when the voltage of the floating power rail in the level shifting circuit suddenly changes. Theoretically, a noise resistance performance can be achieved according to the present disclosure. In addition, only six PMOS transistors, one NLDMOS transistor and one inverter are added, having a simple structure.

3 Claims, 4 Drawing Sheets

(58) Field of Classification Search
USPC ......................................................... 327/333
See application file for complete search history.

(56)                     References Cited

FOREIGN PATENT DOCUMENTS

| CN | 118677218 A | 9/2024 |
|----|-------------|--------|
| JP | 2013012797 A | 1/2013 |

OTHER PUBLICATIONS

Li Liang et al., "High-Speed Level-Shift Circuit for GaN Half-Bridge Driver", Semiconductor Technology, vol. 47, No. 11, Nov. 3, 2022, full text.

* cited by examiner

HIGH-NOISE-RESISTANCE AND LOW-DELAY LEVEL SHIFTING CIRCUIT FOR GaN HALF-BRIDGE DRIVING CHIP

The present application is the national phase of International Patent Application No. PCT/CN2025/073843, titled "HIGH-NOISE-RESISTANCE AND LOW-DELAY LEVEL SHIFTING CIRCUIT FOR GaN HALF-BRIDGE DRIVING CHIP", filed on Jan. 22, 2025, which claims priority to Chinese Patent Application No. 202410721980.8, titled "HIGH-NOISE-RESISTANCE AND LOW-DELAY LEVEL SHIFTING CIRCUIT FOR GaN HALF-BRIDGE DRIVING CHIP", filed on Jun. 5, 2024 with the China National Intellectual Property Administration, both of which are incorporated herein by reference in their entireties.

FIELD

The present disclosure relates to the technical field of power management in integrated circuits, and in particular to a high-noise-resistance and low-delay level shifting circuit for a GaN half-bridge driving chip.

BACKGROUND

Since the voltage at the on/off output point of the power transistor in the half-bridge topology is in a floating state, the supply voltage of the driving circuit at the high-voltage side operates in a floating state accordingly. Generally, a floating power for the driving circuit at the high-voltage side is obtained by using an external bootstrap capacitor. Due to the floating power of the driving circuit at the high-voltage side, a high dv/dt noise is generated when the voltage of the floating power changes. Due to a large parasitic capacitance at a drain electrode of a LDMOS transistor, a potential at the drain electrode of the LDMOS cannot closely follow the change of the voltage of the floating power, resulting in a voltage drop. Once the voltage drop reaches a voltage threshold of a post-circuit, the driving circuit may be mistakenly triggered or even damaged. Compared to the conventional Si-based devices, GaN devices have MHz-level switching frequencies. Thus, the GaN devices have extremely short turn-on and turn-off time, and a high dv/dt noise is to be generated by the floating power rail. Therefore, a level shifting circuit for a GaN device should be of high noise resistance and lower delay.

To suppress the dv/dt noise, a narrow-pulse filtering circuit is arranged to be connected to the level shifting circuit according to the conventional technology, as shown in FIG. 1. In a case of a high dv/dt noise, a great delay of the narrow-pulse filtering circuit is required, resulting in an increasing delay of the driving chip. In addition, the noise-resistance performance may be enhanced by performing shunting, without increasing the circuit delay. However, the noise-resistance performance should be further improved.

SUMMARY

In view of this, a GaN level shifting circuit with high dv/dt noise suppression is provided according to the present disclosure, effectively reducing effect of noise on an output of a circuit without affecting normal signal transmission of the circuit, thereby improving stability and reliability of the circuit.

To achieve the above objectives, the following technical solutions are provided according to the present disclosure.

A high-noise-resistance and low-delay level shifting circuit for a GaN half-bridge driving chip is provided. A path from a floating power rail VDDH to the ground is arranged to simulate the noise generated when the voltage of the floating power rail in the level shifting circuit suddenly changes. Theoretically, a noise resistance performance can be achieved according to the present disclosure. In addition, only six PMOS transistors (MP9-MP14), one NLDMOS transistor (LD3) and one inverter (INV5) are added, having a simple structure.

The high-noise-resistance and low-delay level shifting circuit includes: a first PMOS transistor MP1 to a fourteenth PMOS transistor MP14, a first NMOS transistor MN1 to a seventh NMOS transistor MN7, a first resistor R1, a second resistor R2, a first NLDMOS transistor LD1 to a third NLDMOS transistor LD3, and a first inverter INV1 to a fifth inverter INV5.

A gate electrode of the first NLDMOS transistor LD1 and a gate electrode of the second NLDMOS transistor LD2 are respectively inputted with a low-voltage narrow-pulse signal. A source electrode of the first NLDMOS transistor LD1 and a source electrode of the second NLDMOS transistor LD2 are grounded. A drain electrode of the first NLDMOS transistor LD1 is connected to a drain electrode of the first PMOS transistor MP1, and a drain electrode of the second NLDMOS transistor LD2 is connected to a drain electrode of the seventh PMOS transistor MP7. A gate electrode and a source electrode of the third NLDMOS transistor LD3 are grounded, and a drain electrode of the third NLDMOS transistor LD3 is connected to a drain electrode of the thirteenth PMOS transistor MP13.

A gate electrode and a source electrode of the first NMOS transistor MN1 are connected to a floating ground VSW, and a drain electrode of the first NMOS transistor MN1 is connected to the drain electrode of the first NLDMOS transistor LD1. A source electrode of the second NMOS transistor MN2 is connected to the floating ground VSW, and a gate electrode and a drain electrode of the second NMOS transistor MN2 are shorted and connected to the floating ground VSW through the first resistor R1. A gate electrode of the third NMOS transistor MN3 is connected to the gate electrode of the second NMOS transistor MN2, a source electrode of the third NMOS transistor MN3 is connected to the floating ground VSW, and a drain electrode of the third NMOS transistor MN3 is connected to a drain electrode of the eleventh PMOS transistor MP11. A gate electrode of the fourth NMOS transistor MN4 is connected to a gate electrode of the fifth NMOS transistor MN5, a source electrode of the fourth NMOS transistor MN4 is connected to the floating ground VSW, and a drain electrode of the fourth NMOS transistor MN4 is connected to a drain electrode of the tenth PMOS transistor MP10. The gate electrode and a drain electrode of the fifth NMOS transistor MN5 are shorted and connected to the floating ground VSW through the second resistor R2, and a source electrode of the fifth NMOS transistor MN5 is connected to the floating ground VSW. A gate electrode and a source electrode of the sixth NMOS transistor MN6 are connected to the floating ground VSW, and a drain electrode of the sixth NMOS transistor MN6 is connected to the drain electrode of the second NLDMOS transistor LD2. A gate electrode and a source electrode of the seventh NMOS transistor MN7 are connected to the floating ground VSW, and a drain electrode of the seventh NMOS transistor MN7 is connected to the drain electrode of the third NLDMOS transistor LD3.

A gate electrode and the drain electrode of the first PMOS transistor MP1 are shorted and connected to the drain electrode of the first NLDMOS transistor LD1, and a source electrode of the first PMOS transistor MP1 is connected to a floating power rail VDDH. A gate electrode of the second PMOS transistor MP2 is connected to the gate electrode of the first PMOS transistor MP1, a source electrode of the second PMOS transistor MP2 is connected to the floating power rail VDDH, and a drain electrode of the second PMOS transistor MP2 is connected to a source electrode of the ninth PMOS transistor MP9. A gate electrode of the third PMOS transistor MP3 is connected to the gate electrode of the first PMOS transistor MP1, a source electrode of the third PMOS transistor MP3 is connected to the floating power rail VDDH, and a drain electrode of the third PMOS transistor MP3 is connected to a source electrode of the tenth PMOS transistor MP10. A gate electrode and a source electrode of the fourth PMOS transistor MP4 are shorted and connected to the floating power rail VDDH, and a drain electrode of the fourth PMOS transistor MP4 is connected to the gate electrode of the first PMOS transistor MP1. A source electrode of the fifth PMOS transistor MP5 is connected to the floating power rail VDDH, a gate electrode of the fifth PMOS transistor MP5 is connected to the drain electrode of the second NLDMOS transistor LD2, and a drain electrode of the fifth PMOS transistor MP5 is connected to a source electrode of the eleventh PMOS transistor MP11. A source electrode of the sixth PMOS transistor MP6 is connected to the floating power rail VDDH, a gate electrode of the sixth PMOS transistor MP6 is connected to the gate electrode of the fifth PMOS transistor MP5, and a drain electrode of the sixth PMOS transistor MP6 is connected to a source electrode of the twelfth PMOS transistor MP12. A gate electrode and a drain electrode of the seventh PMOS transistor MP7 are shorted and connected to the gate electrode of the fifth PMOS transistor MP5, and a source electrode of the seventh PMOS transistor MP7 is connected to the floating power rail VDDH. A source electrode and a gate electrode of the eighth PMOS transistor MP8 are shorted and connected to the floating power rail VDDH, and a drain electrode of the eighth PMOS transistor MP8 is connected to the gate electrode of the fifth PMOS transistor MP5. A drain electrode of the ninth PMOS transistor MP9 is connected to the drain electrode of the second NMOS transistor MN2. A drain electrode of the twelfth PMOS transistor MP12 is connected to the drain electrode of the fifth NMOS transistor MN5. A gate electrode of the ninth PMOS transistor MP9, a gate electrode of the tenth PMOS transistor MP10, a gate electrode of the eleventh PMOS transistor MP11 and a gate electrode of the twelfth PMOS transistor MP12 are connected to an output terminal of the fifth inverter INV5. A source electrode of the thirteenth PMOS transistor MP13 is connected to the floating power rail VDDH, and a gate electrode and the drain electrode of the thirteenth PMOS transistor MP13 are shorted and connected to the drain electrode of the third NLDMOS transistor LD3. A gate electrode and a source electrode of the fourteenth PMOS transistor MP14 are shorted and connected to the floating power rail VDDH, and a drain electrode of the fourteenth PMOS transistor MP14 is connected to the drain electrode of the third NLDMOS transistor LD3.

Each of the first inverter INV1, the second inverter INV2, the third inverter INV3, the fourth inverter INV4, and the fifth inverter INV5 is connected between the floating power rail VDDH and the floating ground VSW. An input terminal of the first inverter INV1 is connected to the drain electrode of the third NMOS transistor MN3, and an output terminal of the first inverter INV1 is connected to the drain electrode of the fourth NMOS transistor MN4. An input terminal of the second inverter INV2 is connected to the output terminal of the first inverter INV1, and an output terminal of the second inverter INV2 is connected to the input terminal of the first inverter INV1. An input terminal of the third inverter INV3 is connected to the input terminal of the first inverter INV1, and an output terminal of the third inverter INV3 is connected to an output terminal OUT+. An input terminal of the fourth inverter INV4 is connected to the output terminal of the first inverter INV1, and an output terminal of the fourth inverter INV4 is connected to an output terminal OUT−.

Further, in a case of a positive dVSW/dt noise, a response is performed timely and the positive dVSW/dt noise is blocked by using the ninth PMOS transistor MP9, the tenth PMOS transistor MP10, the eleventh PMOS transistor MP11 and the twelfth PMOS transistor MP12 to control the circuit to operate steadily.

Further, in the case of the positive dVSW/dt noise, the ninth PMOS transistor MP9, the tenth PMOS transistor MP10, the eleventh PMOS transistor MP11 and the twelfth PMOS transistor MP12 are turned off to prevent the positive dVSW/dt noise from being transmitted to an output terminal to control the circuit to operate steadily. A noise resistance performance of the circuit is infinite in an ideal situation, depending on the tolerance of the devices connected to nodes G1, G2, and G3 (that is, depending on gate electrode-source electrode breakdown voltages and source electrode-drain electrode breakdown voltages of the first PMOS transistor MP1, the second PMOS transistor MP2, the third PMOS transistor MP3, the fifth PMOS transistor MP5, the sixth PMOS transistor MP6, the seventh PMOS transistor MP7 and the thirteenth PMOS transistor MP13 and source electrode-drain electrode breakdown voltages of the fourth PMOS transistor MP4, the eighth PMOS transistor MP8 and the fourteenth PMOS transistor MP14). In a case a negative dVSW/dt noise, the second PMOS transistor MP2, the third PMOS transistor MP3, the fifth PMOS transistor MP5 and the sixth PMOS transistor MP6 are turned off, without affecting an output.

The beneficial effects of the present disclosure are as follows. With the high-noise-resistance and low-delay level shifting circuit according to the present disclosure, the effect of the dv/dt noise on the output can be effectively reduced without significantly increasing the circuit delay, achieving high noise resistance performance and effectively applied in the GaN half-bridge driving chips.

The other advantages, objectives, and features of the present disclosure are to be described in the specification. To some extent, the other advantages, objectives, and features of the present disclosure are apparent to those skilled in the art in view of the following description, or may be taught through practice of the present disclosure. The objectives and other advantages of the present disclosure may be achieved and obtained through the following specification.

BRIEF DESCRIPTION OF THE DRAWINGS

To make the objectives, technical solutions, and advantages of the present disclosure clearer, a detailed description for the present disclosure is provided below in conjunction with the accompanying drawings. It should be noted that, except for an input signal IN, all other node signals represent voltage changes relative to a floating ground VSW.

DETAILED DESCRIPTION OF THE EMBODIMENTS

Figure 1:
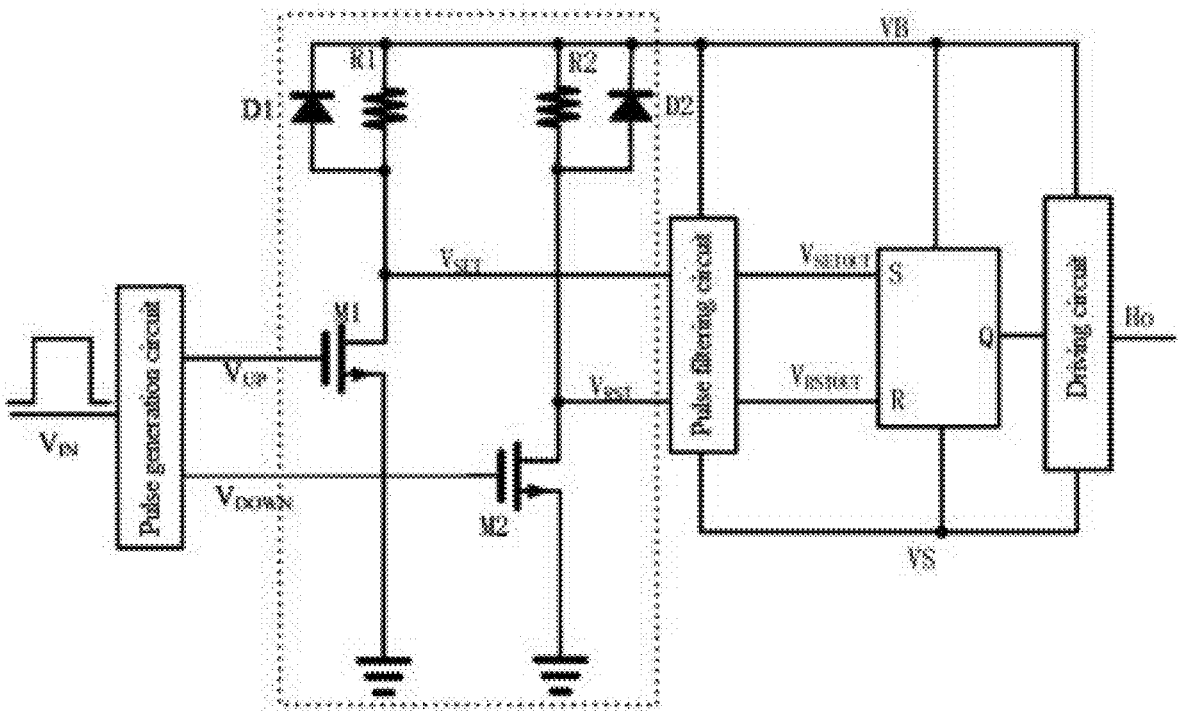
FIG. 1 shows a conventional level shifting circuit.

Hereinafter, the implementation of the present disclosure is illustrated based on specific embodiments. Those skilled in the art may easily understand the other advantages and benefits of the present disclosure from the content disclosed in this specification. The present disclosure may also be implemented or applied through different specific embodiments, and the details in this specification may be improved or modified based on different perspectives and applications without departing from the spirit of the present disclosure. It should be noted that the illustrations provided in the following embodiments only illustrate the basic concept of the present disclosure. Without conflict, the following embodiments and the features in the embodiments may be combined with each other.

The accompanying drawings are only used for illustrative purposes and show only schematic diagrams not physical images, which should not be understood as a limitation to the present disclosure. In order to better illustrate the embodiments of the present disclosure, some components in the drawings may be omitted, enlarged or reduced, which do not represent actual sizes of a product. For those skilled in the art, it is understandable that some well-known structures and explanations of these structures in the drawings may be omitted.

The same or similar symbols in the drawings of the embodiments of the present disclosure correspond to the same or similar components. In the description of the present disclosure, it should be understood that the terms, such as "up", "down", "left", "right", "front" and "back", indicate orientation or positional relationships based on the orientation or positional relationships shown in the drawings, which are only for the convenience of describing and the simplification of describing, and not for indicating or implying that the device or components referred to must have a specific orientation, be constructed and operated in a specific orientation. Therefore, the terms used to describe the positional relationship in the attached drawings are only for illustrative purposes and should not be understood as a limitation of the present disclosure. Those skilled in the art can understand the specific meanings of the above terms based on specific situations.

Figure 2:
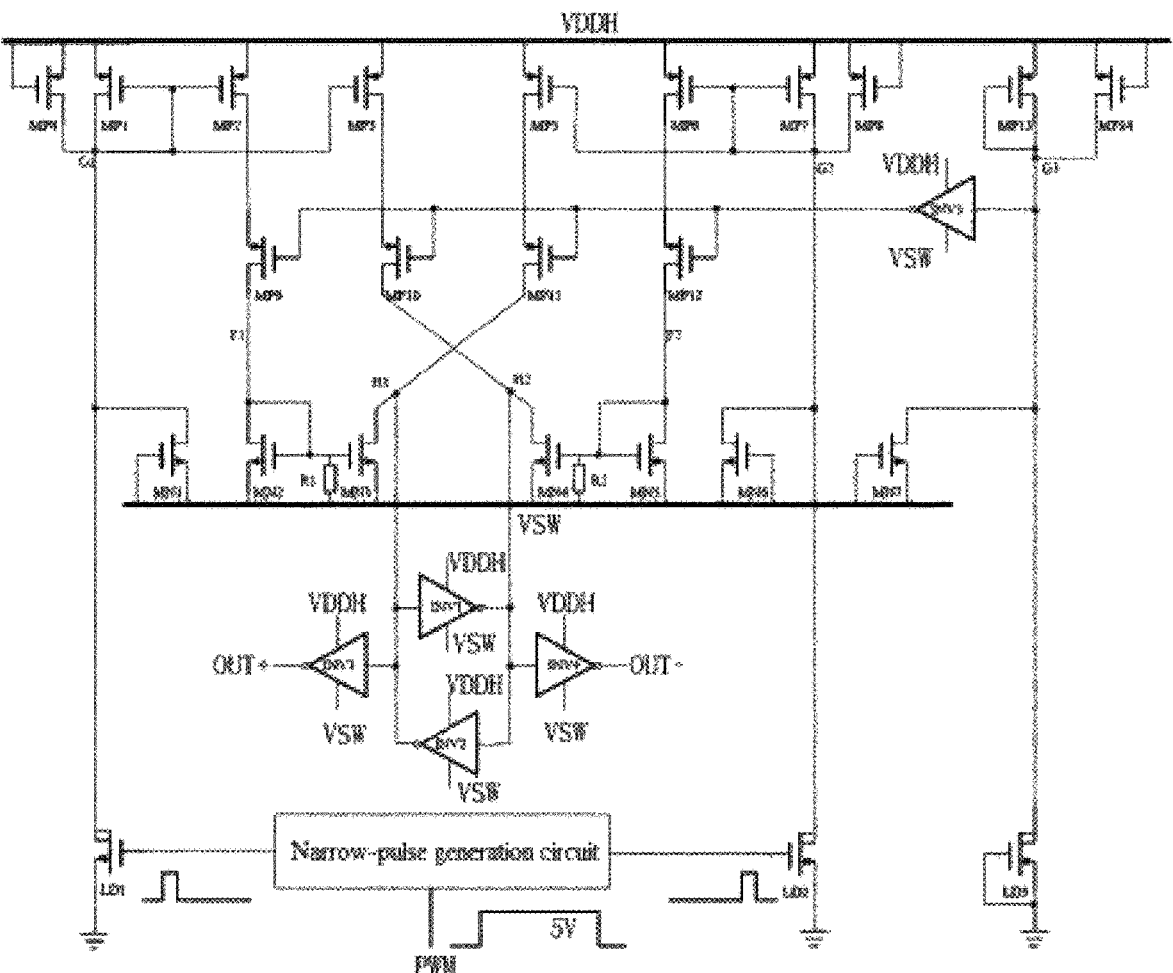
FIG. 2 shows a level shifting circuit applied to a GaN half-bridge driving chip according to the present disclosure.

Reference is made to FIG. 2 to FIG. 6. As shown in FIG. 2, a level shifting circuit according to the present disclosure includes: a first PMOS transistor MP1 to a fourteenth PMOS transistor MP14, a first NMOS transistor MN1 to a seventh NMOS transistor MN7, a first resistor R1, a second resistor R2, a first NLDMOS transistor LD1 to a third NLDMOS transistor LD3, and a first inverter INV1 to a fifth inverter INV5. VDDH represents a voltage of a floating power rail, and VSW represents a floating ground. The resistors R1 and R2 are configured to prevent MN3 and MN4 from being mistakenly turned on in non-operation time periods.

Figure 3:
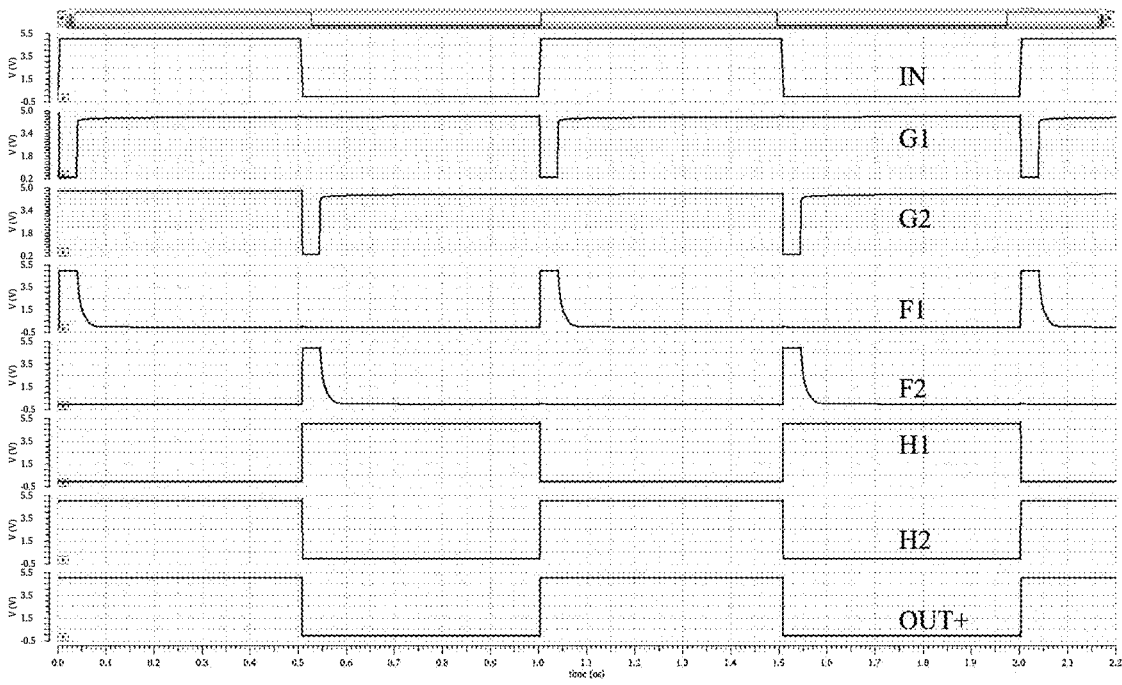
FIG. 3 shows operation waveforms without noise interference.
Figure 4:
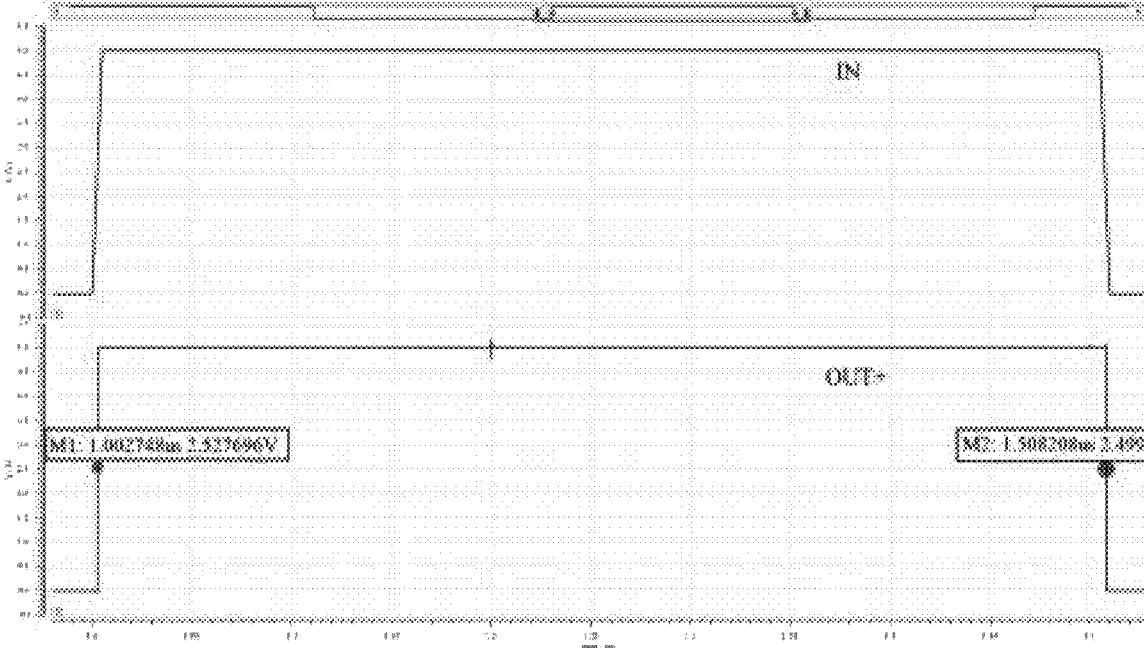
FIG. 4 shows a delay waveform of a level shifting circuit.

FIG. 3 shows waveforms without noise. A square wave signal is inputted, and is processed by a narrow-pulse generator to obtain a narrow-pulse signal. LD1 is turned on at a rising edge of the inputted square wave, and LD2 is turned on at a falling edge of the inputted square wave. After LD1 is turned on, a pull-down current is generated which lowers a potential at a node G1, so that MP2 and MP3 are turned on. MN1 is connected in a diode connection manner to clamp the potential of the node G1, preventing the breakdown of MP1, MP2 and MP3 due to an excessive voltage drop. After MP2 and MP3 are turned on, a pull-down current generated due to low levels at the gate electrodes of MP9 and MP10 are at a low level pulls a potential at a node F1 to a high level, and a potential at a node H1 is lowered a low level due to a current mirror formed by MN2 and MN3. A potential at a node H2 is maintained at a high level. In this way, a potential at an output OUT+ is pulled to a high level by the inverter INV3. After LD2 is turned on, a pull-down current is generated which lowers a potential at a node G2, so that MP5 and MP6 are turned on. MN6 is connected in a diode connection manner to clamp the potential of the node G2, preventing the breakdown of MP5, MP6 and MP7 due to an excessive voltage drop. After MP5 and MP6 are turned on, a pull-down current generated due to low levels at the gate electrodes of MP11 and MP12 are at a low level pulls a potential at a node F2 to a high level, and a potential at a node H2 is lowered a low level due to a current mirror formed by MN4 and MN5. A potential at a node H1 is maintained at a high level. In this way, a potential at an output OUT− is pulled to a high level by the inverter INV4. INV1 and INV2 are arranged for provide positive feedbacks to accelerate signal transmission. As shown in FIG. 4, the rising edge is delayed by 2.72 ns, and the falling edge is delayed by 2.72 ns. However, in applying the level shifting circuit to a GaN half-bridge driving chip, the turning on of the transistors in the upper part of the half-bridge structure may quickly raise the voltage of the floating ground VSW. Since a high-voltage region of the GaN half-bridge driving chip is powered by a bootstrap capacitor, the voltage of the floating power rail VDDH is raised. Due to a large parasitic capacitance of the drain electrodes of the NLDMOSs to the ground, the voltages of the drain electrodes of the NLDMOSs cannot change with the voltage of the floating power rail timely, thus a voltage drop is formed and MP2, MP3, MP5 and MP6 are turned on, and the noise is transmitted to the output terminal, resulting in logical dysfunction.

Figure 5:
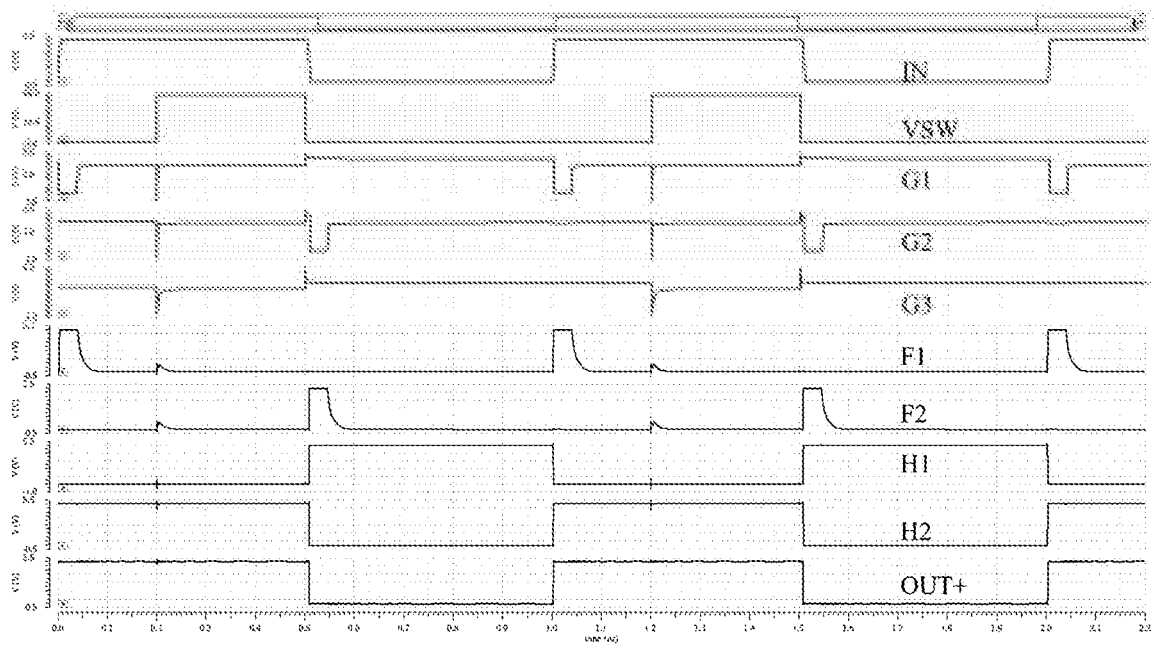
FIG. 5 shows operation waveforms with noise interference.
Figure 6:
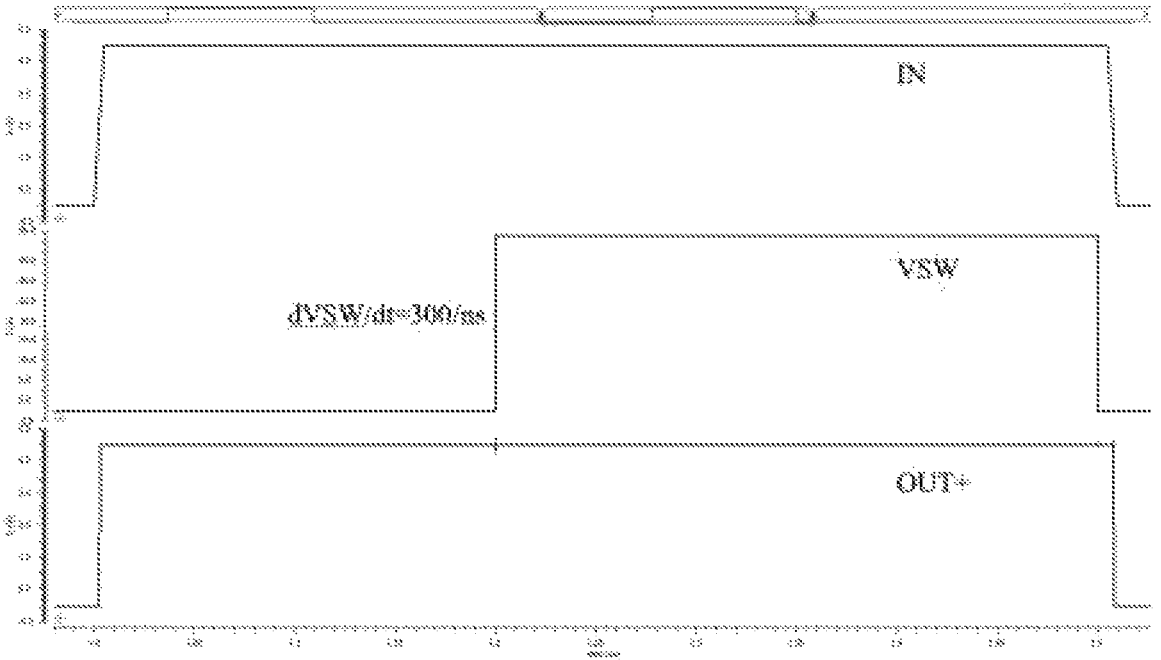
FIG. 6 shows operation waveforms with 300/ns noise interference.

According to the present disclosure, an additional path from the floating power rail VDDH to the ground is arranged. The on-resistance of MP13 is approximately three times greater than the on-resistances of MP1 and MP7. In a case of a positive dVSW/dt noise, the potential at node G3 changes more slowly than the potentials at nodes G1 and G2. When MP2, MP3, MP5 and MP6 are turned on due to the potentials at nodes G1 and G2 decreasing relative to the potential of the floating power rail, node G3 has already triggered the inverter to output a high level and MP9, MP10, MP11 and MP12 are turned off, preventing the noise from being transmitted to the output terminal. The noise resistance performance of the circuit is infinite in an ideal situation, and depends on the tolerance of the devices connected to nodes G1, G2, and G3 (that is, depending on gate electrode-source electrode breakdown voltages and source electrode-drain electrode breakdown voltages of the first PMOS transistor MP1, the second PMOS transistor MP2, the third PMOS transistor MP3, the fifth PMOS transistor MP5, the sixth PMOS transistor MP6, the seventh PMOS transistor MP7 and the thirteenth PMOS transistor MP13 and source electrode-drain electrode breakdown voltages of the fourth PMOS transistor MP4, the eighth PMOS transistor MP8 and the fourteenth PMOS transistor MP14), to ensure stable circuit operation. In a case a negative dVSW/dt noise, MP2, MP3, MP5 and MP6 are turned off, and the output is not affected. MP4, MP8 and MP14 are arranged for clamping the voltages at nodes G1, G2 and G3, thereby protecting the circuit. FIG. 5 and FIG. 6 show operation waveforms with noise. It can be seen that the circuit operates stably without being affected at a dVSW/dt noise equal to 300/ns.

It should be noted that the above embodiments are only used to illustrate rather than limit the technical solutions of the present disclosure. Although the present disclosure has been described in detail with reference to the preferred embodiments, those skilled in the art should understand that modifications or equivalent substitutions may be made to the technical solutions of the present disclosure without departing from the principle and scope of the technical solutions of the present disclosure. All the modifications and equivalent substitutions to the present disclosure fall within the scope of the claims of the present disclosure.

The invention claimed is:

1. A high-noise-resistance and low-delay level shifting circuit for a GaN half-bridge driving chip, comprising: a first PMOS transistor (MP1) to a fourteenth PMOS transistor (MP14), a first NMOS transistor (MN1) to a seventh NMOS transistor (MN7), a first resistor (R1), a second resistor (R2), a first NLDMOS transistor (LD1) to a third NLDMOS transistor (LD3), and a first inverter (INV1) to a fifth inverter (INV5), wherein a gate electrode of the first NLDMOS transistor (LD1) and a gate electrode of the second NLDMOS transistor (LD2) are respectively inputted with a low-voltage narrow-pulse signal; a source electrode of the first NLDMOS transistor (LD1) and a source electrode of the second NLDMOS transistor (LD2) are grounded; a drain electrode of the first NLDMOS transistor (LD1) is connected to a drain electrode of the first PMOS transistor (MP1), and a drain electrode of the second NLDMOS transistor (LD2) is connected to a drain electrode of the seventh PMOS transistor (MP7); and a gate electrode and a source electrode of the third NLDMOS transistor (LD3) are grounded, and a drain electrode of the third NLDMOS transistor (LD3) is connected to a drain electrode of the thirteenth PMOS transistor (MP13);

a gate electrode and a source electrode of the first NMOS transistor (MN1) are connected to a floating ground (VSW), and a drain electrode of the first NMOS transistor (MN1) is connected to the drain electrode of the first NLDMOS transistor (LD1); a source electrode of the second NMOS transistor (MN2) is connected to the floating ground (VSW), and a gate electrode and a drain electrode of the second NMOS transistor (MN2) are shorted and connected to the floating ground (VSW) through the first resistor (R1); a gate electrode of the third NMOS transistor (MN3) is connected to the gate electrode of the second NMOS transistor (MN2), a source electrode of the third NMOS transistor (MN3) is connected to the floating ground (VSW), and a drain electrode of the third NMOS transistor (MN3) is connected to a drain electrode of the eleventh PMOS transistor (MP11); a gate electrode of the fourth NMOS transistor (MN4) is connected to a gate electrode of the fifth NMOS transistor (MN5), a source electrode of the fourth NMOS transistor (MN4) is connected to the floating ground (VSW), and a drain electrode of the fourth NMOS transistor (MN4) is connected to a drain electrode of the tenth PMOS transistor (MP10); the gate electrode and a drain electrode of the fifth NMOS transistor (MN5) are shorted and connected to the floating ground (VSW) through the second resistor (R2), and a source electrode of the fifth NMOS transistor (MN5) is connected to the floating ground (VSW); a gate electrode and a source electrode of the sixth NMOS transistor (MN6) are connected to the floating ground (VSW), and a drain electrode of the sixth NMOS transistor (MN6) is connected to the drain electrode of the second NLDMOS transistor (LD2); and a gate electrode and a source electrode of the seventh NMOS transistor (MN7) are connected to the floating ground (VSW), and a drain electrode of the seventh NMOS transistor (MN7) is connected to the drain electrode of the third NLDMOS transistor (LD3);

a gate electrode and the drain electrode of the first PMOS transistor (MP1) are shorted and connected to the drain electrode of the first NLDMOS transistor (LD1), and a source electrode of the first PMOS transistor (MP1) is connected to a floating power rail (VDDH); a gate electrode of the second PMOS transistor (MP2) is connected to the gate electrode of the first PMOS transistor (MP1), a source electrode of the second PMOS transistor (MP2) is connected to the floating power rail (VDDH), and a drain electrode of the second PMOS transistor (MP2) is connected to a source electrode of the ninth PMOS transistor (MP9); a gate electrode of the third PMOS transistor (MP3) is connected to the gate electrode of the first PMOS transistor (MP1), a source electrode of the third PMOS transistor (MP3) is connected to the floating power rail (VDDH), and a drain electrode of the third PMOS transistor (MP3) is connected to a source electrode of the tenth PMOS transistor (MP10); a gate electrode and a source electrode of the fourth PMOS transistor (MP4) are shorted and connected to the floating power rail (VDDH), and a drain electrode of the fourth PMOS transistor (MP4) is connected to the gate electrode of the first PMOS transistor (MP1); a source electrode of the fifth PMOS transistor (MP5) is connected to the floating power rail (VDDH), a gate electrode of the fifth PMOS transistor (MP5) is connected to the drain electrode of the second NLDMOS transistor (LD2), and a drain electrode of the fifth PMOS transistor (MP5) is connected to a source electrode of the eleventh PMOS transistor (MP11); a source electrode of the sixth PMOS transistor (MP6) is connected to the floating power rail (VDDH), a gate electrode of the sixth PMOS transistor (MP6) is connected to the gate electrode of the fifth PMOS transistor (MP5), and a drain electrode of the sixth PMOS transistor (MP6) is connected to a source electrode of the twelfth PMOS transistor (MP12); a gate electrode and a drain electrode of the seventh PMOS transistor (MP7) are shorted and connected to the gate electrode of the fifth PMOS transistor (MP5), and a source electrode of the seventh PMOS transistor (MP7) is connected to the floating power rail (VDDH); a source electrode and a gate electrode of the eighth PMOS transistor (MP8) are shorted and connected to the floating power rail (VDDH), and a drain electrode of the eighth PMOS transistor (MP8) is connected to the gate electrode of the fifth PMOS transistor (MP5); a drain electrode of the ninth PMOS transistor (MP9) is connected to the drain electrode of the second NMOS transistor (MN2); a drain electrode of the twelfth PMOS transistor (MP12) is connected to the drain electrode of the fifth NMOS transistor (MN5); a gate electrode of the ninth PMOS transistor (MP9), a gate electrode of the tenth PMOS transistor (MP10), a gate electrode of the eleventh PMOS transistor (MP11) and a gate electrode of the twelfth PMOS transistor (MP12) are connected to an output terminal of the fifth inverter (INV5); a source electrode of the thirteenth PMOS transistor (MP13) is connected to the floating power rail (VDDH), and a gate electrode and the drain electrode of the thirteenth PMOS transistor (MP13) are shorted and connected to the drain electrode of the third NLDMOS transistor (LD3); and a gate electrode and a source electrode of the fourteenth PMOS transistor (MP14) are shorted and connected to the floating power rail (VDDH), and a drain electrode of the fourteenth PMOS transistor (MP14) is connected to the drain electrode of the third NLDMOS transistor (LD3); and each of the first inverter (INV1), the second inverter (INV2), the third inverter (INV3), the fourth inverter (INV4), and the fifth inverter (INV5) is connected between the floating power rail (VDDH) and the floating ground (VSW); an input terminal of the first inverter (INV1) is connected to the drain electrode of the third NMOS transistor (MN3), and an output terminal of the first inverter (INV1) is connected to the drain electrode of the fourth NMOS transistor (MN4); an input terminal of the second inverter (INV2) is connected to the output terminal of the first inverter (INV1), and an output terminal of the second inverter (INV2) is connected to the input terminal of the first inverter (INV1); an input terminal of the third inverter (INV3) is connected to the input terminal of the first inverter (INV1), and an output terminal of the third inverter (INV3) is connected to an output terminal (OUT+); and an input terminal of the fourth inverter (INV4) is connected to the output terminal of the first inverter (INV1), and an output terminal of the fourth inverter (INV4) is connected to an output terminal (OUT−).

2. The high-noise-resistance and low-delay level shifting circuit according to claim 1, wherein in a case of a positive dVSW/dt noise, a response is performed timely and the positive dVSW/dt noise is blocked by using the ninth PMOS transistor (MP9), the tenth PMOS transistor (MP10), the eleventh PMOS transistor (MP11) and the twelfth PMOS transistor (MP12) to control the circuit to operate steadily.

3. The high-noise-resistance and low-delay level shifting circuit according to claim 2, wherein in the case of the positive dVSW/dt noise, the ninth PMOS transistor (MP9), the tenth PMOS transistor (MP10), the eleventh PMOS transistor (MP11) and the twelfth PMOS transistor (MP12) are turned off to prevent the positive dVSW/dt noise from being transmitted to the output terminal to control the circuit to operate steadily, wherein a noise resistance performance of the circuit is infinite in an ideal situation, depending on gate electrode-source electrode breakdown voltages and source electrode-drain electrode breakdown voltages of the first PMOS transistor (MP1), the second PMOS transistor (MP2), the third PMOS transistor (MP3), the fifth PMOS transistor (MP5), the sixth PMOS transistor (MP6), the seventh PMOS transistor (MP7) and the thirteenth PMOS transistor (MP13) and source electrode-drain electrode breakdown voltages of the fourth PMOS transistor (MP4), the eighth PMOS transistor (MP8) and the fourteenth PMOS transistor (MP14); and in a case of a negative dVSW/dt noise, the second PMOS transistor (MP2), the third PMOS transistor (MP3), the fifth PMOS transistor (MP5) and the sixth PMOS transistor (MP6) are turned off, without affecting an output.

* * * * *